(12) United States Patent
Behrens

(10) Patent No.: US 8,013,452 B2
(45) Date of Patent: Sep. 6, 2011

(54) WIRE-BONDED SEMICONDUCTOR COMPONENT WITH REINFORCED INNER CONNECTION METALLIZATION

(75) Inventor: Jörg Behrens, Hamburg (DE)

(73) Assignee: NXP B.V., Eindhoven (NL)

( * ) Notice: Subject to any disclaimer, the term of this patent is extended or adjusted under 35 U.S.C. 154(b) by 114 days.

(21) Appl. No.: 10/581,162

(22) PCT Filed: Dec. 1, 2004

(86) PCT No.: PCT/IB2004/052628
§ 371 (c)(1),
(2), (4) Date: Mar. 31, 2008

(87) PCT Pub. No.: WO2005/057654
PCT Pub. Date: Jun. 23, 2005

(65) Prior Publication Data
US 2008/0230920 A1 Sep. 25, 2008

(30) Foreign Application Priority Data
Dec. 10, 2003 (EP) .................. 03104621

(51) Int. Cl.
*H01L 23/48* (2006.01)
(52) U.S. Cl. ........ 257/777; 257/784; 257/758; 257/750; 257/786; 257/E23.194

(58) Field of Classification Search .................. 257/784, 257/777, 758, 750, 786, E23.194
See application file for complete search history.

(56) References Cited

U.S. PATENT DOCUMENTS

| | | | |
|---|---|---|---|
| 5,723,822 A * | 3/1998 | Lien .............................. | 174/250 |
| 6,143,396 A * | 11/2000 | Saran et al. .................... | 428/162 |
| 6,359,326 B1* | 3/2002 | Utsunomiya et al. ......... | 257/538 |
| 6,680,545 B2* | 1/2004 | Young et al. .................. | 257/787 |
| 6,864,578 B2* | 3/2005 | Angell et al. ................. | 257/737 |
| 2002/0187634 A1 | 12/2002 | Saran et al. | |
| 2003/0178644 A1 | 9/2003 | Lee et al. | |

FOREIGN PATENT DOCUMENTS

EP 0 875 934 11/1998

* cited by examiner

*Primary Examiner* — Junghwa M Im

(57) ABSTRACT

Consistent with an example embodiment, there is a semiconductor component comprising a semiconductor chip made of a doped silicon substrate. The chip is doped into a semiconductor device and structured, and includes an inner connection metallization in a contact window. The inner connection metallization of said semiconductor chip is connected to the respective outer connection metallization by a wire bond connection, wherein the inner connection metallization comprises a reinforcing system having an open grid structure on the doped silicon substrate.

6 Claims, 3 Drawing Sheets

8

WIRE-BONDED SEMICONDUCTOR COMPONENT WITH REINFORCED INNER CONNECTION METALLIZATION

The invention relates to a wire-bonded semiconductor component comprising a semiconductor chip made of a doped silicon substrate, which chip is doped into a semiconductor device and structured, and comprises an inner connection metallization in a contact window, and said inner connection metallization of said semiconductor chip is connected to the respective outer connection metallization of the semiconductor component by a bond wire loop.

A wire-bonded semiconductor chip is electrically connected with the outside world via bond wires, which form a connection between the semiconductor chip and the outer connection metallizations on a ceramic substrate, on a spider-like carrier, or on the connection pins of a lead frame as well as with the connection metallizations of another semiconductor chip. On the semiconductor chip, the bond wire terminates in a current connecting part which forms a metallurgical contact together with the metallization provided on the chip surface in a contact window.

Between the current connecting part of the bond wire, the metallization and the chip surface, an electrically well-conducting, mechanically stable and reliable metallurgical contact must be created.

However, the process steps involved in wire bonding are very sensitive. Experience has shown that the cold welding processes customarily used lead to substantial mechanical loading of the chip surface. Particularly in the case of ultrasonic wire bonding, both mechanical loading and ultrasonic stresses are applied to the contacts. The damage incurred often is not apparent directly during wire bonding, but manifests itself when subsequent encapsulation in a package, accelerated service life tests or temperature variations during operation of the semiconductor device apply further thermomechanical loading to the semiconductor component.

The damage may appear as microcracks that may expand, leading to fatal fractures (cracking), or as craters in the brittle and mechanically weak dielectric layers, which frequently extend into the metallization (cratering), or as detachment of the metallization layer.

In the case of integrated circuits it is known to provide a reinforcing system underneath the large bond pads arranged on the top level of metallization. For example, EP 0 875 934 discloses a reinforcing system for bond pads, which comprises at least one dielectric layer under the bond pad and a patterned reinforcing system within the dielectric layer.

In the case of semiconductor chips with discrete semiconductor devices, contact is not necessarily made via a metallization level provided above a dielectric layer (intermediate oxide), but may alternatively be made directly on the chip surface via a metallurgical contact in a contact window in the insulation coating or in the passivation layer in order to limit the amount of space needed for the contact and increase performance.

In discrete semiconductor devices, the contact surface via which the current connecting part of the bond wire contacts the metallization on the chip surface is comparatively small, so that the connection strength in the metallurgic contact is correspondingly very weak. As a result, a connection such that the bonding wire is connected to the chip surface via the metallization is particularly liable to cracking or cratering, with the cracks or craters extending into the surface of the chip.

To solve the above-mentioned problem, it is an object of the present invention to provide a wire-bonded semiconductor component wherein the tendency of the wire bond connection to become detached from the semiconductor chip surface is reduced and, at the same time, the electrical properties have not changed substantially.

In accordance with the invention, this object is achieved by a wire-bonded semiconductor component comprising a semiconductor chip 2 made of a doped silicon substrate, which chip is doped into a semiconductor device and structured, and comprises an inner connection metallization 7 in a contact window, and said inner connection metallization of said semiconductor chip is connected to the respective outer connection metallization by a wire bond connection 9, and the inner connection metallization comprises a reinforcing system 8 having an open grid structure on the doped silicon substrate.

The invention is based on the inventive concept that an inner connection metallization with a reinforcing system according to the invention enables a large-area, force-coupled contact to be attained; as well as on the inventive concept that by compressing two layers of materials having different physical properties, the lateral lines of force in the area of contact are interrupted.

The reinforcing system thus reduces the likelihood of problems induced by thermomechanical stresses. The force coupling between the inner connection metallization and the semiconductor chip surface is continuously interrupted. Any stresses that occur are not transmitted and hence cannot add up to a critical size.

The reinforcing system also minimizes the difference between the coefficients of thermal expansion of the connection metallization and the semiconductor chip and thus improves the reliability of the semiconductor component.

In accordance with a preferred embodiment of the invention, the reinforcing system is an open grid structure formed from an isolation coating.

It is particularly preferred that the reinforcing system is an open grid structure formed from a thermal oxide. Thermal oxide is internally generated by conversion of the semiconductor surface and hence forms a characteristic layer.

Within the scope of the present invention it is preferred that the grid structure is formed so as to be an open groove structure.

In accordance with another embodiment of the invention, the grid structure may be formed so as to be an open tube structure.

An optimum effect is achieved when the surface proportion of the grid structure is more than 50% of the contact area.

These and other aspects of the invention are apparent from and will be elucidated with reference to the embodiments described hereinafter.

Although the invention is described hereinafter with reference to SMD bipolar transistors as semiconductor component, it should be understood by those skilled in the art that the invention is not limited to said transistors.

The invention relates in general to all semiconductor components with wire bond connections, and in which the metallurgical contact of the bond wire loop is in direct contact with the connection metallization at the crystal surface of the semiconductor chip.

The semiconductor device may preferably be a discrete bipolar transistor, notably a planar transistor or field effect transistor, but also a semiconductor diode, notably a junction diode or Schottky diode, as well as a sensor device, a capacitor, a resistor or a combination of these devices and other devices.

In accordance with an embodiment of the invention, a semiconductor device of this type is notably a discrete bipolar transistor with a suitably doped and structured semiconductor chip having a base, collector and emitter contact, which semiconductor chip is made of a doped silicon substrate and is enclosed in a housing 1, and its base, collector and emitter contact is connected to the respective base, collector and emitter terminal of the housing by a wire bond connection 9. The housing is customarily a surface mountable housing, a so-termed SOT or SMD housing, which is preferably composed of a lead frame with a plastic encapsulation.

Figure 1:
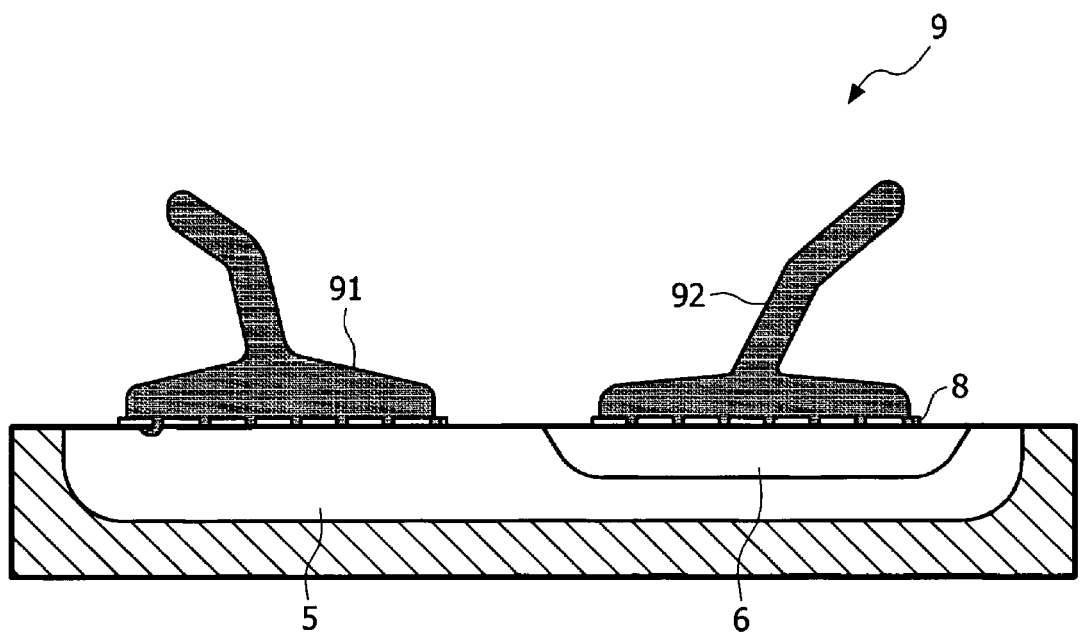
FIG. 1 is a diagrammatic cross-sectional view of a semiconductor chip with wire-bond contacts, metallization and reinforcing system.
Figure 2:
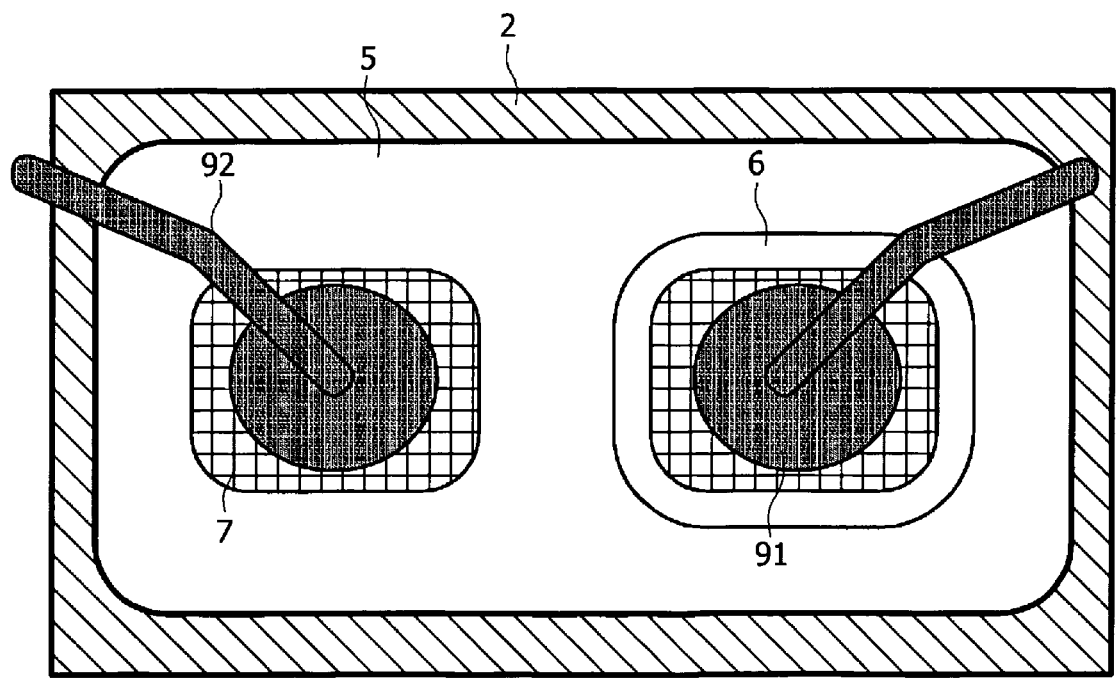
FIG. 2 is a diagrammatic plan view of a semiconductor chip with wire-bond contacts, metallization and reinforcing system.

Although a very wide range of discrete transistors are commercially available, they all share a common construction: the silicon substrate of the active chip serves as the collector contact. The silicon substrate, which is for example n-type doped, is connected by means of its collector contact (metallization) on the lower side of the chip to the collector terminal of the housing, or is arranged thereon and attached thereto. Emitter and base contacts to the semiconductor are arranged in very fine geometries (<1 μm) on the upper side of the chip. As shown in FIGS. 1 and 2, the emitter and base contacts are provided in the form of an inner connection metallization on the doped emitter and base regions at the surface of the semiconductor chip. These emitter and base contacts are connected in each case, via a bond wire, to the respective emitter or base contacts of the carrier.

Such semiconductor chips are customarily built into SMD (Surface-Mounted Device) housings, wherein the housing contact, on which the semiconductor chip is provided, defines the collector contact of the housing. The emitter and the base are bonded via bond wires to the remaining contacts of the housing or to a neighboring semiconductor chip. The chip as well as the bond wires are protected by the housing.

Figure 4:
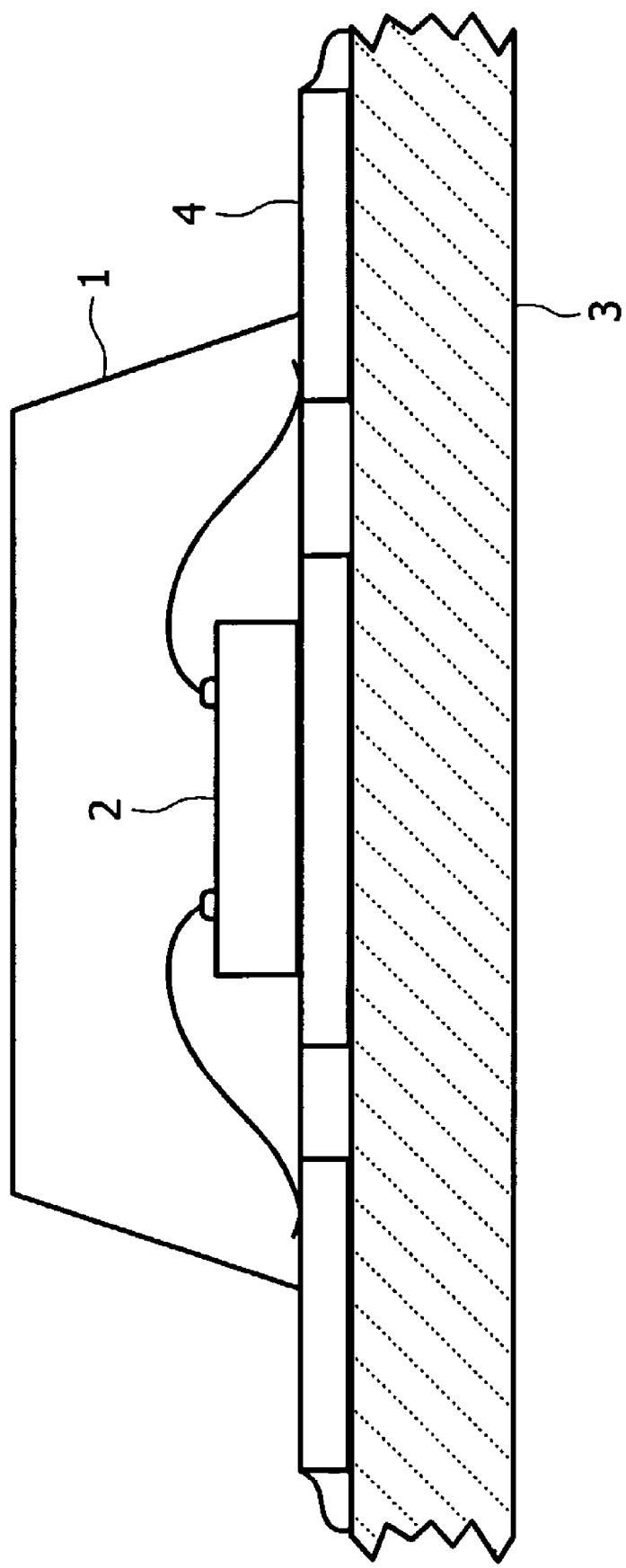
FIG. 4 is a diagrammatic side view of a conventional SMD package with a semiconductor chip, a wire bond connection and a lead frame with connection pins on a substrate.

FIG. 4 diagrammatically shows a side view of this embodiment of the semiconductor component 2 in accordance with the invention in an SMD housing 1 on a substrate, for example a circuit board 3. A semiconductor device 2 is attached to the lead frame 4. A wire connection 9 is arranged between the inner connection metallization on the device 2 and the outer connection metallization on the connection pins 4 of the lead frame by means of a bond wire 92. In this case, the current connecting part of the bond wire on the semiconductor chip is connected by a ball bond 91 and the other current connecting part of the bond wire is connected by a wedge bond on the contact surface of the connection pin 4 of the lead frame.

The contact surface for the connection metallizations is defined by a contact window in an insulation coating that extends as far as the chip surface.

For the material of this insulation coating use can be made, for example, of a layer of thermal oxide, phosphor glass, LTO or TEOS, or multilayer coatings of these materials may be applied, wherein the contact holes are etched using dry or wet chemical etching.

In accordance with the invention, the inner connection metallization comprises a reinforcing system with an open grid structure.

The reinforcing system is formed by a coating arranged in an open grid structure.

The coating may be formed preferably from well-known dielectric materials which are used for the manufacture of insulation and passivation layers for semiconductor devices.

The selection of the material used for the insulation coating results from the necessity of good adhesive properties of the semiconductor material as well as from necessary dielectric properties so as to obtain mutual insulation of the metallizations. For the material use is made of the compounds of the semiconductor material with oxygen and/or nitrogen, for example thermal oxide, phosphor glass, LTO, TEOS or multilayer coatings of these materials. Also the compounds of aluminum with oxygen and/or nitrogen, such as aluminum sesqui oxide, can suitably be used. The layer may further be composed of silicon, in particular the silicon material of the semiconductor chip.

It is particularly preferred that the reinforcing system is formed so as to have an open grid structure of a thermal oxide 4.

In the course of the manufacturing process, thermal oxide is automatically developed in various process steps, for example, as a mask oxide, surface protection, diffusion source, intermediate oxide and as a capping layer during ion implantation.

As thermal oxide is formed by the conversion of the semiconductor surface, its manufacture is insensitive to impurities on the semiconductor surface and it exhibits excellent bonding strength.

The open grid structure is formed from the thermal oxide or from another material for the insulation coating, in the form of lands or support points, separating the individual grid openings from each other. The grid openings may be embodied so as to be, for example, grooves, notably as an open structure of parallel and equidistant stripes, but also as meanders or as a closed stripe structure, preferably as a circular ring or as a rectangular ring, or as a hole structure for individual support points.

The grid openings may alternatively be tubular with a round or preferably polygonal, notably rectangular, base.

Figure 3:
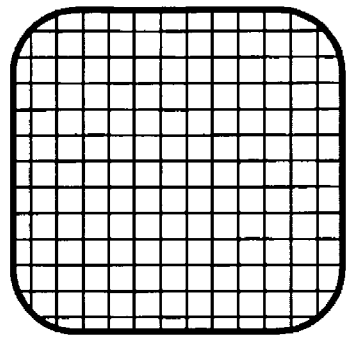
FIG. 3 shows various reinforcing systems having an open grid structure.
Figure 3:
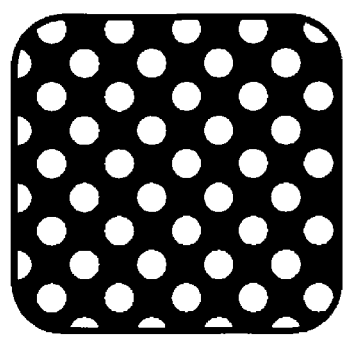
Figure 3:
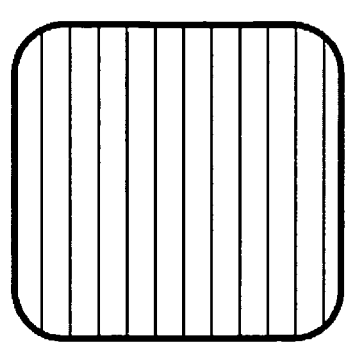
Figure 3:
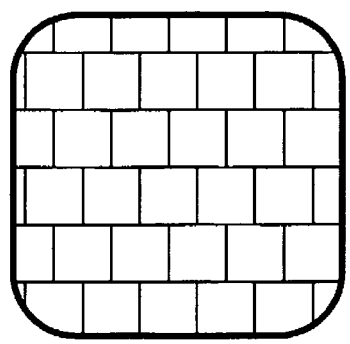
Figure 3:
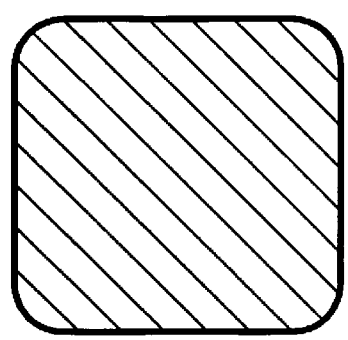
Figure 3:
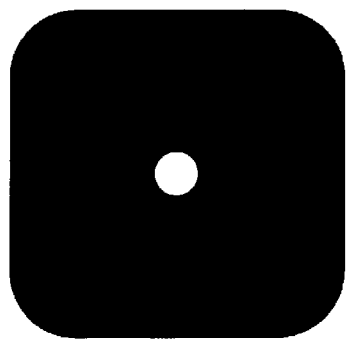
Figure 3:
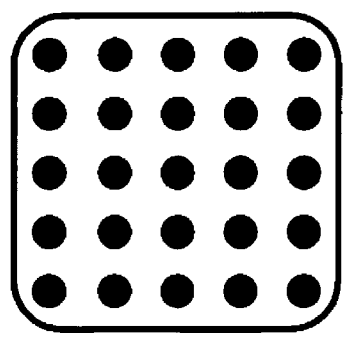
Figure 3:
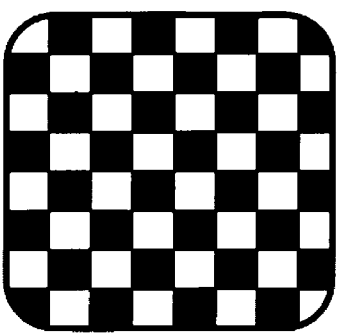

A number of embodiments of the open grid structures are shown in FIG. 3.

The reinforcing system may have any height suitable to take up stresses initiated at the metallizations. This means that it must be thick enough to have a sufficiently large damping effect with respect to stresses, so that these stresses do not cause damage to the semiconductor surface. The reinforcing system preferably has a thickness above approximately 500 nm. In addition, the thickness of the reinforcing system should not be such that it causes brittleness. The thickness preferably lies in the range between 10 nm and 10 μm.

The ratio of the height h of the layer to the width b of the grid lands preferably lies in the range of 1:25 to 1:50. The ratio between the area of the grid lands and the area of the grid openings preferably lies in the range of 30 to 95%, very preferably at >50%, and more preferably at >70%.

The reinforcing system may be entirely arranged above the surface of the semiconductor. The reinforcing system may alternatively be arranged, either entirely or partly, below the surface of the semiconductor.

The metallization is applied to the contact area of the semiconductor chip that has remained as a result of the reinforcing system. As a result, the connection between the metallization and the semiconductor chip does not extend throughout the surface of the latter, and hence the rigidity of the bond, consisting of the surface of the chip, the metallization, the reinforcing system and the current connecting part of the bond wire is reduced. The reinforcing system causes the mechanical reaction of the bond wire on the contact surface to be reduced. The tensile stresses occurring in the contact region can no longer add up to a critical value that exceeds the strength of the material and that manifests itself in the form of cracks.

The metallization may be formed from any suitable, conductive material, such as a metal. For example, aluminum, copper or many other alloys can be used.

In the semiconductor component in accordance with the invention, the inner connection metallization is connected to the respective outer connection metallization via a bond wire loop 9.

A wire-bonded semiconductor chip is furthermore encapsulated in a housing independently of the integration technique used and of the intended application.

A semiconductor component with a reinforcing system, which comprises an open grid structure, can be manufactured by means of the following process steps:

doping and structuring of a doped silicon semiconductor substrate into a semiconductor device, within the scope of this process, an oxide formed in an annealing process is provided as the grid structure in the contact windows by means of an adapted etch mask, application and structuring of a metallization, manufacture of a full-surface insulation layer in the upper region of the doped silicon substrate, chip-bonding the semiconductor chip onto a carrier, formation of a wire-bond connection between the semiconductor chip and the carrier, encapsulation.

A semiconductor component with a reinforcing system, which comprises an open grid structure, can additionally be manufactured by the following process steps:

doping and structuring of a doped silicon semiconductor substrate into a semiconductor device, manufacture of a full-surface insulation layer in the upper region of the doped silicon substrate, selective etching through the insulation layer using an open grid structure-producing mask so as to form a contact window with a reinforcing structure, provision and structuring of a metallization, chip bonding the semiconductor chip onto a carrier, formation of a wire-bond connection between the semiconductor chip and the carrier, encapsulation.

For the manufacture of a planar bipolar transistor in planar technique, the necessary p-n junctions in the semiconductor substrate are created by specific ion implantation of dopants from the surface in a number of successive steps. For the starting material use is made of, in general, 200 to 625 µm-thick, n or p-conductive silicon single-crystal slices, which are coated with a protective layer of a highly resistant, dopant-impermeable silicon dioxide or silicon nitride. "Windows" are formed in this protective layer by means of etching, through which acceptor or donor substances, for example boron in the case of an n-conductive silicon substrate and phosphor in the case of a p-conductive silicon substrate, are implanted, resulting in, respectively, p- and n-conductive regions having a p-n junction to the bulk material. These regions form the base zone of the planar transistor. The windows are partly closed by a further $SiO_2$ layer, and opposite or increased dopings are implanted through the openings remaining free or newly etched, which dopings bring about an inversion of the conduction type, and which generate n-conductive or p-conductive emitter regions as well as the p-n junction between each base region and emitter region, or which constitute highly doped connection areas of the contact.

Each implantation step comprises the actual implantation and a subsequent diffusion process at high temperatures, which influences the depth and the surface concentration of the doped region.

To form the connection area with the reinforcing system, a separate layer is either deposited or formed by annealing. Alternatively, a layer formed in the preceding manufacturing steps may be used for this purpose.

Preferably, the contact window-insulating layer is manufactured by thermal oxidation of silicon.

The methods of applying thermal silicon dioxide layers include, for example, the process of thermally growing in an oxygen or oxygen-water vapor atmosphere at a temperature in the range between 900 and 1100° C. In this process, oxygen flows as a reaction gas over the hot silicon surface. The oxygen combines with the silicon so as to form silicon dioxide, resulting in the formation of an amorphous, glass-like layer at the surface of the silicon. The thermal oxidation processes can be divided into dry processes and wet processes by adding water vapor. If high operating temperatures are to be avoided, or higher layer thicknesses are to be attained, a wet oxidation process is preferred.

The contact window-insulation layer is structured in known manner by means of a customary photolithographic process, and said structuring may be carried out using a mask to expose the contact window by means of etching.

For this purpose, a photosensitive thin film is spin coated onto the upper side of the device. Said film is exposed using electron beam lithography, laser beam interference or UV-radiation, etc., after which the desired structure is developed. After said developing step, the remaining, masking structure protects areas of the material of the device against a subsequent etch or milling process (for example ion milling, reactive ion etching, wet-chemical etching, electrochemical etching, photochemical etching, chemically supported ion beam etching, or a combination thereof, etc.), in order to transfer a suitable structure to the material of the device, after which the mask layer is removed.

The photosensitive, masking film can be subsequently removed by means of a solvent or an oxygen plasma.

The topography of the lands or grooves should preferably be chosen so as to be as high as possible in order to be very beneficial. In the case of grid structures from an annealing process, the height of the structures made of thermal oxide typically lies in the range of approximately 100 nm to 300 nm. Larger layer thicknesses can be achieved by means of a thermal oxide.

The contact windows thus formed in the emitter and base regions have a typical structure size or diameter in the range of fractions of a micrometer up to a few micrometers within the actual contact window whose structure size or diameter ranges generally from 50 to several hundred micrometers.

These dimensions are not compulsory, however, but selected only by way of example.

With the process steps indicated hereinabove, it is achieved that the bottom of the contact window, i.e. the surface of the monocrystalline silicon substrate which is exposed as a result of the contact window, is interspersed with a reinforcing system.

The areas of the reinforcing system in the contact window that have become exposed are used to form the metallization for the metallic base and emitter contacts.

This surface, which has been previously cleaned, is then provided with a continuous metallization, for example by evaporation (electron beam evaporation) or sputtering. These methods of providing the metallization are prior art and known per se. The material used for the first metallization preferably is aluminum, copper or silver, or alloys of these metals. In order to preclude reactions between said materials and the underlying semiconductor material, and to improve the adhesion and reduce the transition resistance values between metal and semiconductor material, one or more thin films of titanium, chromium, molybdenum, tungsten, platinum, palladium, silver, nickel or compounds of these metals with silicon, nitrogen or carbon may be applied directly onto the initial semiconductor slice. The layer thickness of the metallization lies in the range up to 20 μm.

Subsequently, the inner connection metallization is structured such that, in a customary photoprocess followed by etching, contacts are formed, the overall height of which is the same for the emitter sections as well as for the base sections. Removal of the areas extending between the contacts may take place by wet-chemical etching or dry etching.

The metallization in fact completes the manufacture of the semiconductor device. Testing of the devices may take place already. Since, however, the slices must be sawn, and the individual chips thus obtained glued or soldered into the housing and provided with a synthetic resin encapsulation, it is necessary to produce the desired slice thickness by means of a grinding-back process, prepare the rear side for packaging and protect the sensitive circuit and, notably, the metallization from damage. To achieve this, a protective layer, referred to as passivation, is applied to the slices.

Besides protection of the circuits during the final processing steps for packaging, the so-termed assembly, this passivation also serves to provide long-term protection from environmental influences. This is necessary, in particular, in the case of circuits for industrial or automotive applications since a synthetic resin encapsulation cannot fully preclude the penetration of moisture or detrimental gases. In these fields of application, a double layer of oxide and nitride proved successful, the nitride being particularly dense and the oxide serving as a buffer against the high mechanical stress from the nitride.

The passivation layer may be made from any suitable insulation material, such as silicon dioxide ($SiO_2$).

This passivation must be removed again in the areas of the bond pads, using a final photolithographic masking process and an etch process, in order to expose the electric contact of the semiconductor component under the protective coating on the chip surface at the location of the contact points.

At the end of the planar process, the semiconductor slices are subjected to a sawing process wherein the component crystals (chips) in which the respective semiconductor devices (discrete devices or integrated circuits) are contained are present in individualized form.

Finally, the semiconductor component is readied in that the chip is connected, for example by gluing or soldering, to a lead frame, i.e. a carrier having the connection pins or leads.

Attachment of the semiconductor chip onto a carrier, for example a spider-like carrier, a lead frame or a ceramic carrier, which later forms part of the housing, is carried out by gluing or forming an alloy (wafer bonding); in the case of attaching by wafer bonding, the process is referred to as eutectic bonding.

Subsequently, the external electric contacts are formed in that metallic conductor tracks which originate from the contact windows of the semiconductor devices, are widened into contact or bonding spots, on which the connection wires extending to the exterior can be attached.

The connection areas (pads) of the chip are subsequently connected to the associated metallic lead frame areas by means of wire bonding.

Contacting of the emitter and base regions takes place by means of a wire bonding process.

In the case of nailhead or ball-wire-bond processes, a capacitor discharge causes the end portion of a wire to melt into a ball which is pressed onto the bond-contact area. At this location, the ball and the metal are welded together, lifted again and guided to the second contact area on the connection pins of the lead frame. At this location, it is subjected to a press-on force and sheared off, resulting in the bond connection.

The wedge-wire-bond process is similar to the ball-bond process, with the exception that the wire is deformed by a wedge in the wire direction.

After said wire bonding process, the chip is encapsulated together with the bond wires and the adjacent areas of the lead frame by means of an insulating compression molded material or a ceramic lid, so that a so-termed "package" is formed, beyond which the connection pins of the lead frame extend in lateral directions.

LIST OF REFERENCE NUMERALS 1 housing
2 semiconductor chip
3 substrate
4 connection pins
5 base
6 emitter
7 metallization
8 reinforcing system
9 bond pad
91 metallurgical contact
92 bond wire

The invention claimed is:
1. A semiconductor component comprising:
discrete semiconductor device comprising:
a silicon substrate having an emitter and a base;
the emitter having an emitter contact formed thereon, the emitter contact comprising:
a reinforcing system formed directly on the emitter in an open grid structure within an emitter contact window, wherein the open grid structure forms individual grid openings that leave portions of the emitter exposed within the emitter contact window; and
a connection metallization formed in between the open grid structure of the reinforcing system and directly on the emitter;
wherein the reinforcing system and the connection metallization have different physical properties;
the base having a base contact formed thereon, the base contact comprising:
a reinforcing system formed directly on the base in an open grid structure within a base contact window, wherein the open grid structure forms individual grid openings that leave portions of the base exposed within the base contact window; and
a connection metallization formed in between the open grid structure of the reinforcing system and directly on the base;
wherein the reinforcing system and the connection metallization have different physical properties
a leadframe having connection pins; and
a bond wire connected between the emitter contact and a connection pin of the leadframe; and a bond wire connected between the base contact and a connection pin of the leadframe.

2. A semiconductor component as claimed in claim 1, characterized in that the reinforcing system having an open grid structure is formed from an insulation coating.

3. A semiconductor component as claimed in claim 1, characterized in that the grid structure is formed so as to be an open groove structure.

4. A semiconductor component as claimed in claim 1, characterized in that the grid structure may be formed so as to be an open tube structure.

5. A semiconductor component as claimed in claim 1, characterized in that the area of the grid structure of thermal oxide constitutes >50% of the area of the contact window.

6. A semiconductor component as claimed in claim 1, wherein the open grid structure of the reinforcing system comprises oxide lands formed directly on the silicon substrate.

* * * * *